(12) United States Patent
Kim

(10) Patent No.: US 7,941,586 B2
(45) Date of Patent: May 10, 2011

(54) FLASH MEMORY DEVICE AND MEMORY SYSTEM CONTROLLING A COPY-BACK PROGRAM OPERATION IN HARDWARE

(75) Inventor: Won-Tae Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 876 days.

(21) Appl. No.: 11/748,063

(22) Filed: May 14, 2007

(65) Prior Publication Data
US 2008/0229000 A1    Sep. 18, 2008

(30) Foreign Application Priority Data
Mar. 12, 2007    (KR) .......... 10-2007-0024090

(51) Int. Cl.
*G06F 12/00*    (2006.01)
(52) U.S. Cl. .......... 711/103; 711/154; 711/165
(58) Field of Classification Search .......... None
See application file for complete search history.

(56) References Cited

U.S. PATENT DOCUMENTS

| 5,802,553 A | 9/1998 | Robinson et al. |
| 6,614,685 B2 | 9/2003 | Wong |
| 2005/0172065 A1* | 8/2005 | Keays .......... 711/103 |

FOREIGN PATENT DOCUMENTS

| JP | 2006244017 | 9/2006 |
| JP | 2006277736 | 10/2006 |
| KR | 100263672 B1 | 5/2000 |
| KR | 1020060006554 | 1/2006 |
| KR | 100626393 B1 | 9/2006 |

* cited by examiner

*Primary Examiner* — Shawn X Gu
(74) *Attorney, Agent, or Firm* — Valentine & Whitt, PLLC

(57) ABSTRACT

A memory system comprises a flash memory, a processing unit, and a flash controller including address and control registers, the address and control registers being configured to receive information from the processing unit, wherein the flash controller is configured to control a copy-back program operation of the flash memory in hardware based on information stored in the address and control registers.

17 Claims, 17 Drawing Sheets

Fig. 3

| H/W C/B PGM Start |
|---|
| INT Enable |
| INT Status |
| ECC Auto correction |
| H/W C/B Repeat count |
| Source ADD incre/decre |
| Destination ADD incre/decre |
| Plane selection |

FLASH MEMORY DEVICE AND MEMORY SYSTEM CONTROLLING A COPY-BACK PROGRAM OPERATION IN HARDWARE

BACKGROUND OF THE INVENTION

1. Field of the Invention

The present disclosure generally relates to electronic memories, and more particularly, the present invention relates to a flash memory device and to a memory system which includes flash memory.

A claim of priority is made under 35 U.S.C §119 to Korean Patent Application Number 10-2007-0024090 filed on Mar. 12, 2007, the entire contents of which are hereby incorporated by reference.

2. Description of the Related Art

Semiconductor memory devices can generally be divided into two main categories, namely, volatile memory devices and non-volatile memory devices. Volatile memory devices include devices such as, for example, Random Access Memory (RAM), Dynamic Random Access Memory, and other such devices. A salient feature of volatile memory devices is that they loose stored data in the event of a power loss. On the other hand, non-volatile memory devices such as, for example, flash memories retain their stored data even in the event of a power loss.

Because of their ability to store data even in the event of a power loss, flash memories are becoming increasingly popular in the electronics industry. Indeed, flash memories are used in various electronic devices such as, for example, digital cameras and portable music players. Furthermore, due to advances in semiconductor fabrication technology, the storage capacity of flash memories is being constantly increased. Thus, relatively large amounts of data can now be stored in a flash memory device. While the storage capacities of flash memories are being increased, the performance of flash memories may be limited by a number of factors. For example, certain operations need to be performed in a flash memory device that may limit the operating speed, i.e., the speed at which data may be written to and read from the flash memory device. These operations may include a copy-back program operation, a merge operation, and other such operations.

A copy-back program operation includes copying data from one page in the memory to another. A merge operation includes copying data from one memory block to another. Such operations may need ancillary operations such as, for example, generating a command, determining a source address/destination address, determining the data to be copied/merged, etc. In conventional memory devices, these and other such operations are performed by the firmware associated with the memory device. However, the time taken to perform these operations using firmware may be more than the time taken if these operations were to be performed in hardware. Furthermore, the time needed to perform these operations may limit the overall operating speed of the memory device. This problem may be exacerbated as the amount of data stored in the memory device increases. That is, an increase in storage capacity may be accompanied by an increase in the time for performing copy-back, merge, and other such operations using firmware.

There is therefore a need to perform internal operations of a flash memory device using hardware. The present disclosure is directed towards overcoming one or more limitations associated with the conventional flash memory devices.

SUMMARY OF THE INVENTION

One aspect of the present disclosure includes a memory system. The memory system comprises a flash memory, a processing unit, and a flash controller including address and control registers, the address and control registers being configured to receive information from the processing unit, wherein the flash controller is configured to control a copy-back program operation of the flash memory in hardware based on information stored in the address and control registers.

Another aspect of the present disclosure includes a flash memory device. The flash memory device includes a memory cell array including a plurality of pages, a read/program circuit configured to perform read and program operations with respect to the memory cell array, a repeat register configured to store repeat data, and control logic which controls the read/program circuit so as to repeat a copy-back program operation according to the repeat data stored in the repeat register.

BRIEF DESCRIPTION OF THE DRAWINGS

FIG. 3 is a diagram showing a control register illustrated in FIG. 1 according to an exemplary disclosed embodiment.

DETAILED DESCRIPTION OF EXEMPLARY EMBODIMENTS

Figure 1:
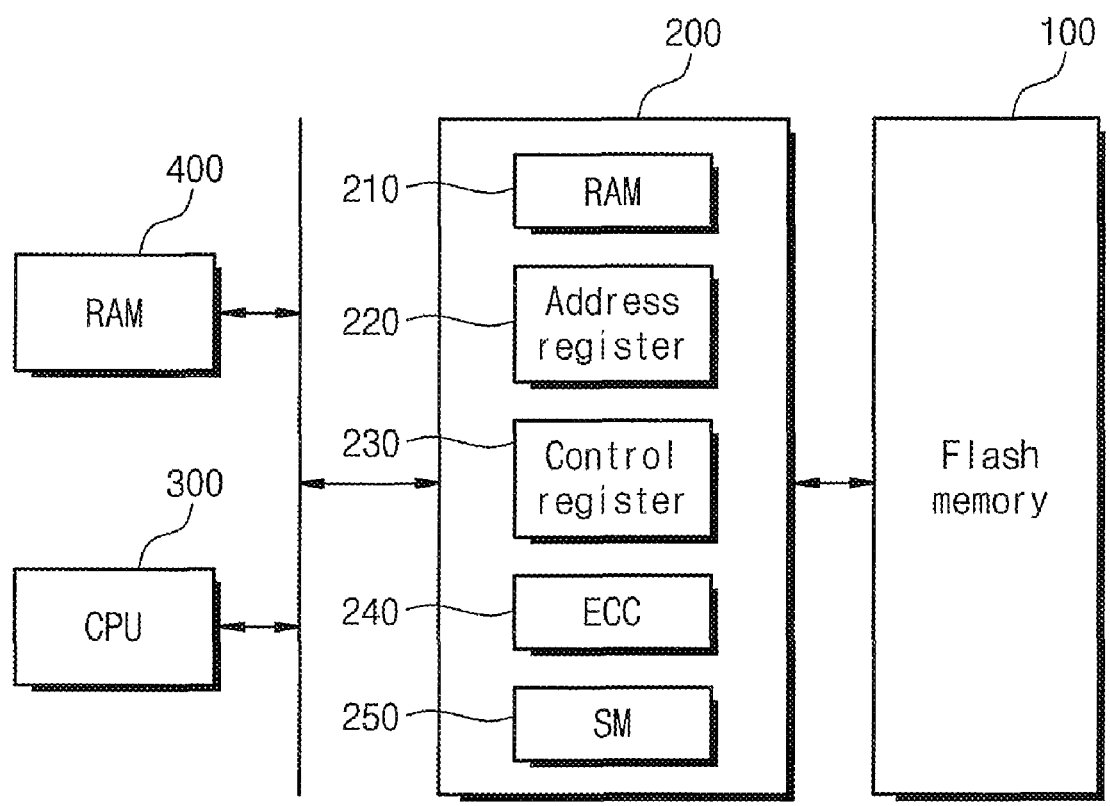
FIG. 1 is a block diagram showing a flash memory-based memory system according to an exemplary disclosed embodiment.

The present disclosure will now be described more fully hereinafter with reference to the accompanying drawings, in which exemplary embodiments of the disclosure are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram showing a flash memory-based memory system according to an exemplary disclosed embodiment. Referring to FIG. 1, an exemplary flash memory system includes a flash memory 100, a flash controller 200, a central processing unit (CPU) 300, and RAM 400, all of which are electrically connected to a system bus. The flash controller 200 may control the flash memory 100 in response to a control of the CPU 300. In particular, the flash controller 200 may be configured to process a copy-back program operation of the flash memory 100 in hardware. In an exemplary embodiment, the flash controller 200 may include RAM 210, an address register 220, a control register 230, ECC 240, and a state machine 250.

Figure 2A:
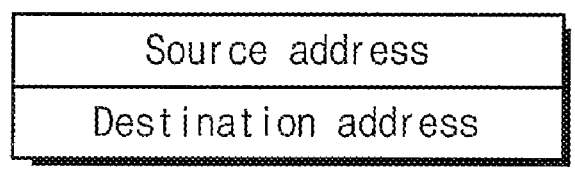
FIGS. 2A and 2B are diagrams showing an address register illustrated in FIG. 1 according to an exemplary disclosed embodiment.
Figure 2B:
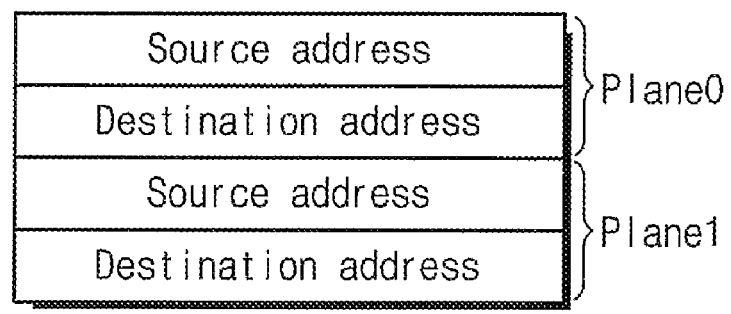

The RAM 210 is used to temporarily store source data read out from the flash memory during a copy-back program operation. To this end, the RAM 210 may have sufficient capacity to store a page of data. The address register 220 may use to store a source address and a destination address provided from the CPU 300. In the case that a copy-back program operation is carried out within the same plane, as illustrated in FIG. 2A, the source and destination addresses of the same plane may be stored in the address register 220. On the other hand, in a case where a copy-back program operation is performed within different planes, as illustrated in FIG. 2B, source and destination addresses of each plane may be stored in the address register 220.

Still referring to FIG. 1, the control register 230 may be used to store control information for a copy-back program operation. This control information may be provided from the CPU 300. For example, as illustrated in FIG. 3, the control register 230 may store hardware copy-back program start information, interrupt enable information, interrupt status information, ECC auto correction information, hardware repeat number information, source address increment/decrement information, destination address increment/decrement information, plane selection information, and so on. The ECC 240 may detect an error with respect to data transferred from the flash memory 100 to the RAM 210, correct the detected error, and transfer the error-corrected data to the flash memory 100. The state machine 250 may be configured to control an overall operation of a copy-back program operation according to control information stored in the control register 230. Furthermore, the state machine 250 may generate an interrupt to the CPU 300 when a copy-back program operation is completed.

The CPU 300 provides information to the address and control registers 220 and 230, respectively, when a copy-back program operation is requested, and waits until an interrupt is generated from the state machine 250. This means that the CPU 300 does not take part in a copy-back program operation after providing information to the registers 220 and 230 for a copy-back program operation. The RAM 400 may be used to store data to be stored in the flash memory 100.

In some embodiments, the flash controller 200, the CPU 300, and the RAM 400 may constitute a memory controller for controlling the flash memory. In addition, the RAM 210 of the flash controller 200 may be isolated from the system bus.

The disclosed memory system may be configured to automatically perform a copy-back program operation of a flash memory 100 through hardware instead of software or firmware. This may reduce the time taken to perform internal operations within the flash memory such as, for example, a copy-back operation, a merge operation, and other such operations. Thus, it may be possible to improve the overall performance of the memory system.

Figure 4:
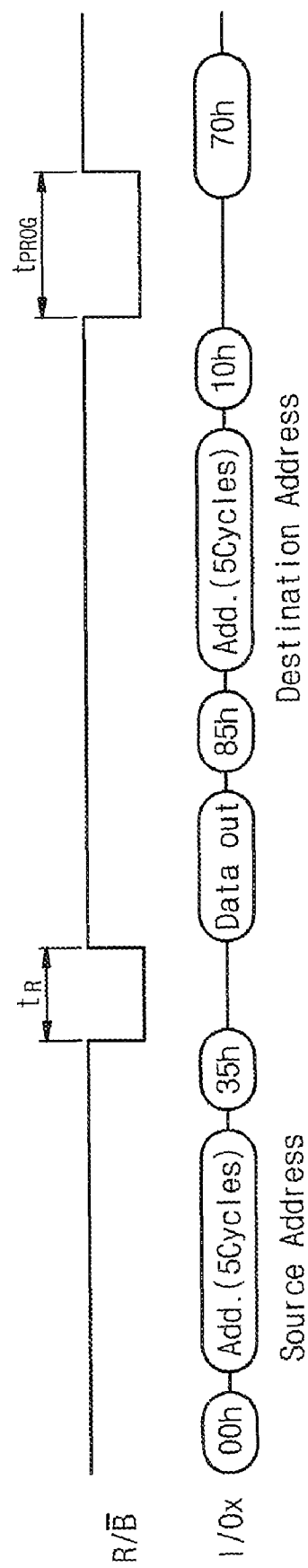
FIG. 4 is a timing diagram for describing a copy-back program operation of a memory system according to an exemplary disclosed embodiment.
Figure 5:
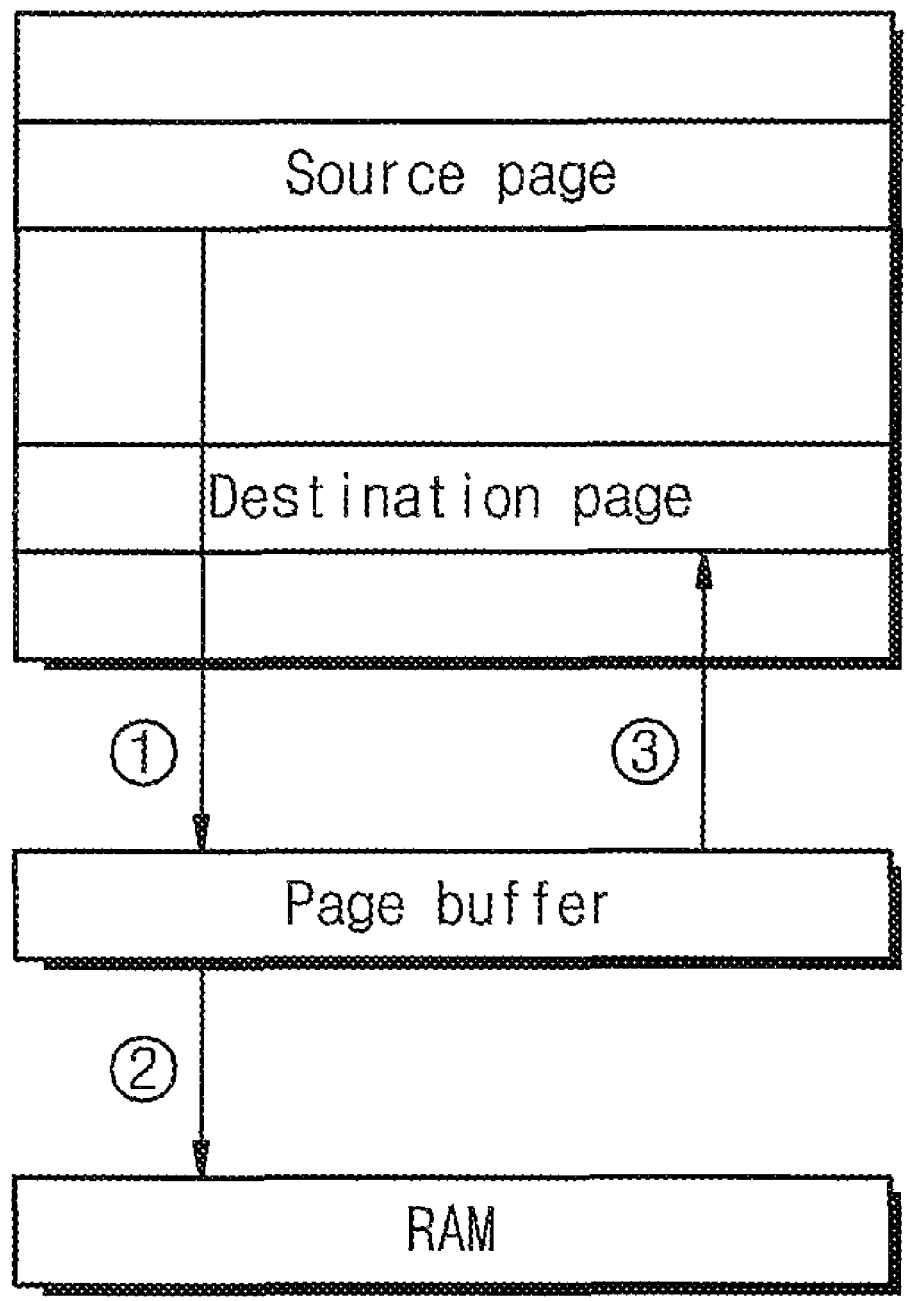
FIG. 5 is a diagram showing data flow during a copy-back program operation of a memory system according to an exemplary disclosed embodiment.

FIG. 4 is a timing diagram for describing a copy-back program operation of a memory system according to an exemplary disclosed embodiment, and FIG. 5 is a diagram showing data flow during a copy-back program operation of a memory system according to an exemplary disclosed embodiment.

When a copy-back program operation is required, CPU 300 may provide information to address and control registers 220 and 230 of a flash controller 200. For example, the address register 220 may be set with a source address and destination address, and the control register 230 may be set with necessary control information. For convenience of description, assume that a copy-back program operation for one page is performed within the same plane. Furthermore, also assume that hardware copy-back program start information, interrupt enable information, interrupt status information, and ECC auto correction information are set in the control register 230 as control information.

Once the hardware copy-back program start information is set, as illustrated in FIG. 4, a 0h command, a source address, and a 35h command may be output sequentially to a flash memory 100 from the flash controller 200. Afterwards, during a read time tR, data of a source page may be read out by a page buffer (in FIG. 5, marked by ①). After the read time tR elapses, data stored in the page buffer may be transferred to RAM 210 in the flash controller 200 in a given unit (in FIG. 5, marked by ②). Because the ECC auto correction information is set, an error detection operation may be performed with respect to data transferred to the RAM 210. If no error is detected, then as illustrated in FIG. 4, the flash controller 200 may output an 85h command, a destination address, and a 10h command to the flash memory 100 sequentially. The flash memory 100 may program data of the page buffer in a destination address according to an input of the 10h command (in FIG. 5, marked by ③). That is, a program operation may be performed during a time tPROG. After the program operation is completed, a state machine 250 of the flash controller 200 may confirm whether the program operation has passed or failed. Moreover, the state machine 250 may set the interrupt status information of the control register 230 to program pass/fail according to the confirmed result, and generate an interrupt. Afterwards, the CPU 300 may confirm the interrupt status information in response to the interrupt.

One skilled in the art will appreciate that an operation for confirming completion of a copy-back program operation may different than the one discussed above without departing from the scope of the disclosure. For example, it is possible to confirm program pass/fail by outputting a status read command 70h to a flash memory 100 at a low-to-high transition of an R/nB pin. Alternatively, in a case where a continuous copy-back program operation is needed, program pass/fail of a previous program operation may be confirmed by outputting a status read command 70h to a flash memory 100 before a copy-back program operation commences. For convenience of description, in FIG. 4, a status read operation is illustrated with respect to the former case.

Figure 6:
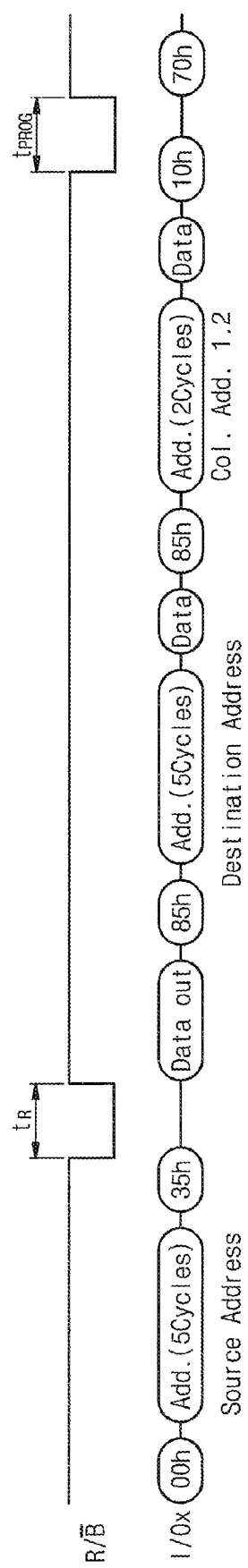
FIG. 6 is a timing diagram for describing a copy-back program operation of a memory system according to an exemplary disclosed embodiment.
Figure 7:
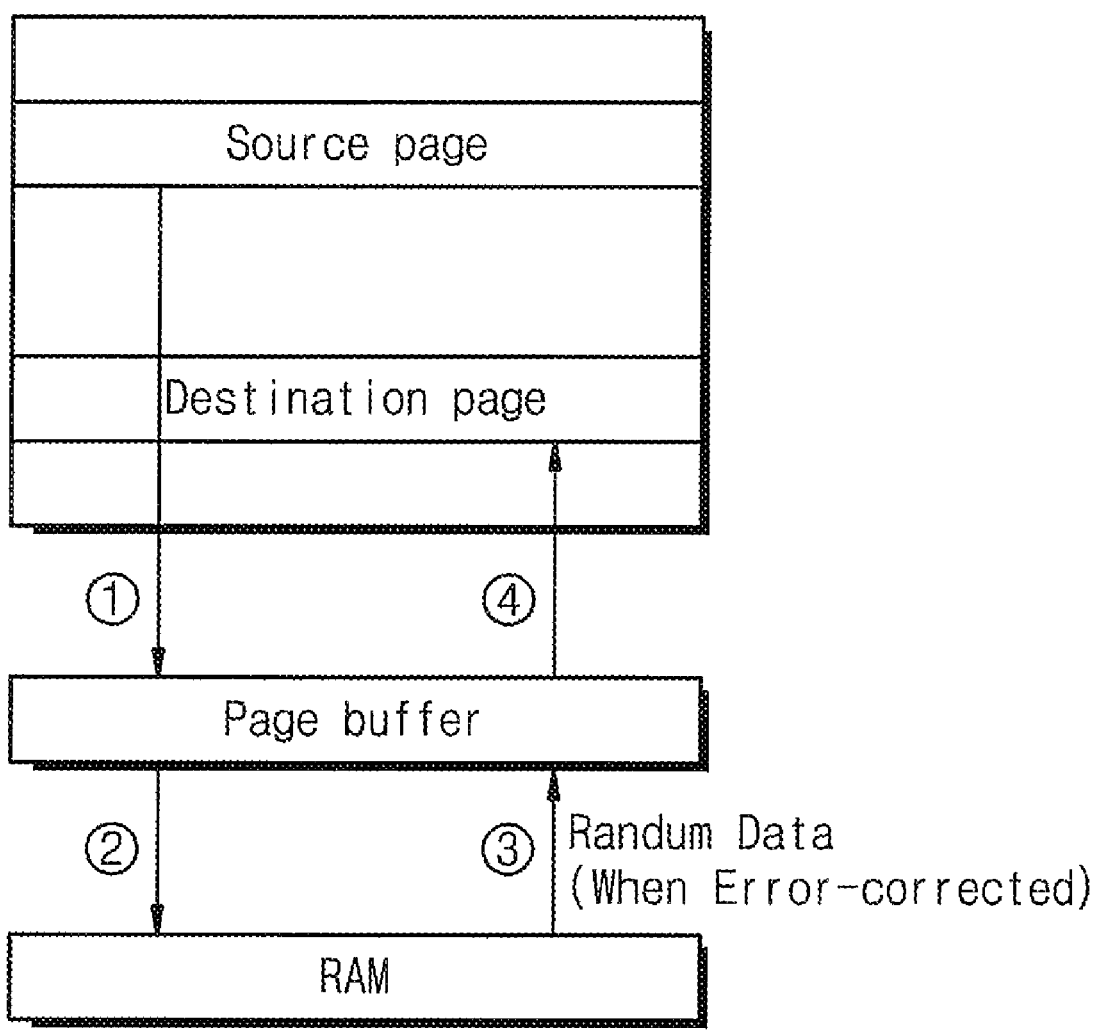
FIG. 7 is a diagram showing data flow during a copy-back program operation of a memory system according to an exemplary disclosed embodiment.
Figure 8:
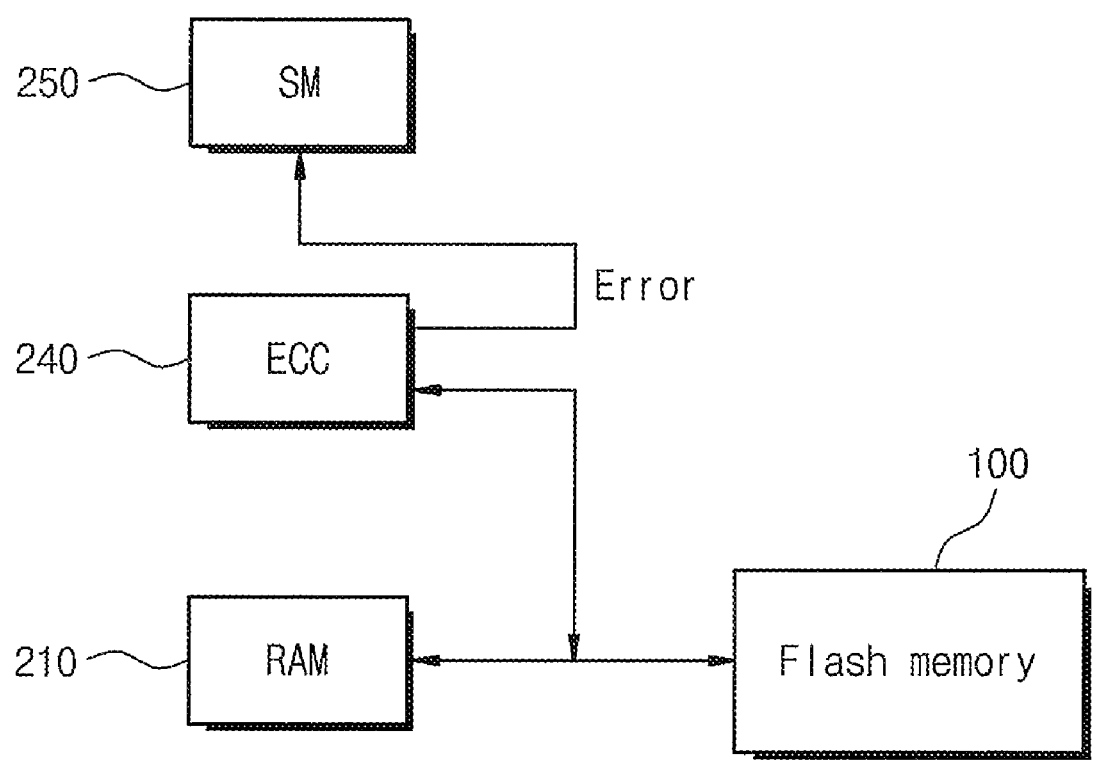
FIG. 8 is a diagram for describing an error detecting and correcting operation carried out during a copy-back program operation according to an exemplary disclosed embodiment.

FIG. 6 is a timing diagram for describing a copy-back program operation of a memory system according to an exemplary disclosed embodiment, FIG. 7 is a diagram showing data flow during a copy-back program operation of a memory system according to the present invention, and FIG. 8 is a diagram for describing an error detecting and correcting operation carried out during a copy-back program operation. An explanation of an exemplary operation of When a copy-back program operation is required, CPU 300 may provide information to address and control registers 220 and 230, respectively, of a flash controller 200. For example, the address register 220 may be set with a source address and destination address, and the control register 230 may be set with necessary control information. For convenience of description, assume that a copy-back program operation for one page is performed within the same plane. Furthermore, also assume that hardware copy-back program start information, interrupt enable information, interrupt status information, and ECC auto correction information are set in the control register 230 as control information.

Once the hardware copy-back program start information is set, as illustrated in FIG. 4, a 00h command, a source address, and a 35h command may be output sequentially to a flash memory 100 from the flash controller 200. Afterwards, during a read time tR, data of a source page may be read out by a page buffer (in FIG. 7, marked by ①). After the read time tR elapses, data stored in the page buffer may be transferred to RAM 210 in the flash controller 200 in a given unit (in FIG. 7, marked by ②). Because the ECC auto correction information is set, an error detection operation may be performed with respect to data transferred to the RAM 210.

A detailed description of an exemplary error detecting operation is provided as follows. Referring to FIG. 8, ECC 240 may detect an error with respect to data transferred from the flash memory 100 to the RAM 210. If an error is detected, the ECC 240 may read erroneous data from the RAM 210 and correct an error with respect to the read data. Furthermore, the ECC 240 may inform the state machine 250 about the error generation and simultaneously transfer position information of the erroneous data to the state machine 250. Upon generation of the error, the state machine 250 may transfer an 85h command and a destination address to the flash memory 100. Then, as illustrated in FIG. 6, the state machine 250 may transfer a column address of the error-corrected data to the flash memory 100, and the ECC 240 may transfer the error-corrected data (that is, random data) to the flash memory 100 (in FIG. 7, marked by ③).

The flash memory 100 may program data of the page buffer in a destination page according to an input of the 10h command (in FIG. 7, marked by ④). That is, a program operation may be performed during a time tPROG. After the program operation is completed, the state machine 250 of the flash controller 200 may confirm whether the program operation is passed or failed. The state machine 250 may then set the interrupt status information of the control register 230 to program pass/fail according to the confirmed result, and generate an interrupt. Afterwards, the CPU 300 may confirm the interrupt status information in response to the interrupt. Specifically, the interrupt status information may include program pass/fail as well as ECC error information.

As described above, a copy-back program operation of a flash memory may be performed automatically based on hardware control alone, that is, the flash controller 200, without intervention of software (or firmware).

The copy-back program operation illustrated in FIG. 4 is an operation performed with respect to one page only. However, copy-back program operations with respect to plural pages can also be automatically performed based on hardware control in the manner described above. For example, control information of a control register 230 may be set by CPU 300 so that copy-back program operations are continuously performed with respect to plural pages, which will be more fully described below.

The control register 230 may be set with additional information for multiple page copy-back operations. This additional information may include, for example, hardware copy-back repeat number information, source address increment/decrement information, and destination address increment/decrement information. This information may be set together with hardware copy-back program start information, interrupt enable information, interrupt status information, and ECC auto correction information. In an exemplary embodiment, data from a page corresponding to a source address (set in the address register 220) may be copy-back programmed to a page corresponding to a destination address (set in the address register 220). Once a copy-back program operation ends, it may be considered as one program pass, then a source address and destination address are increased by 1 under the control of the state machine 250. Then, a copy-back program operation for a page of the increased/decreased source address is repeated in the same manner as described above. To this end, a copy-back program operation may be repeated by hardware copy-back repeat number information.

Figure 9:
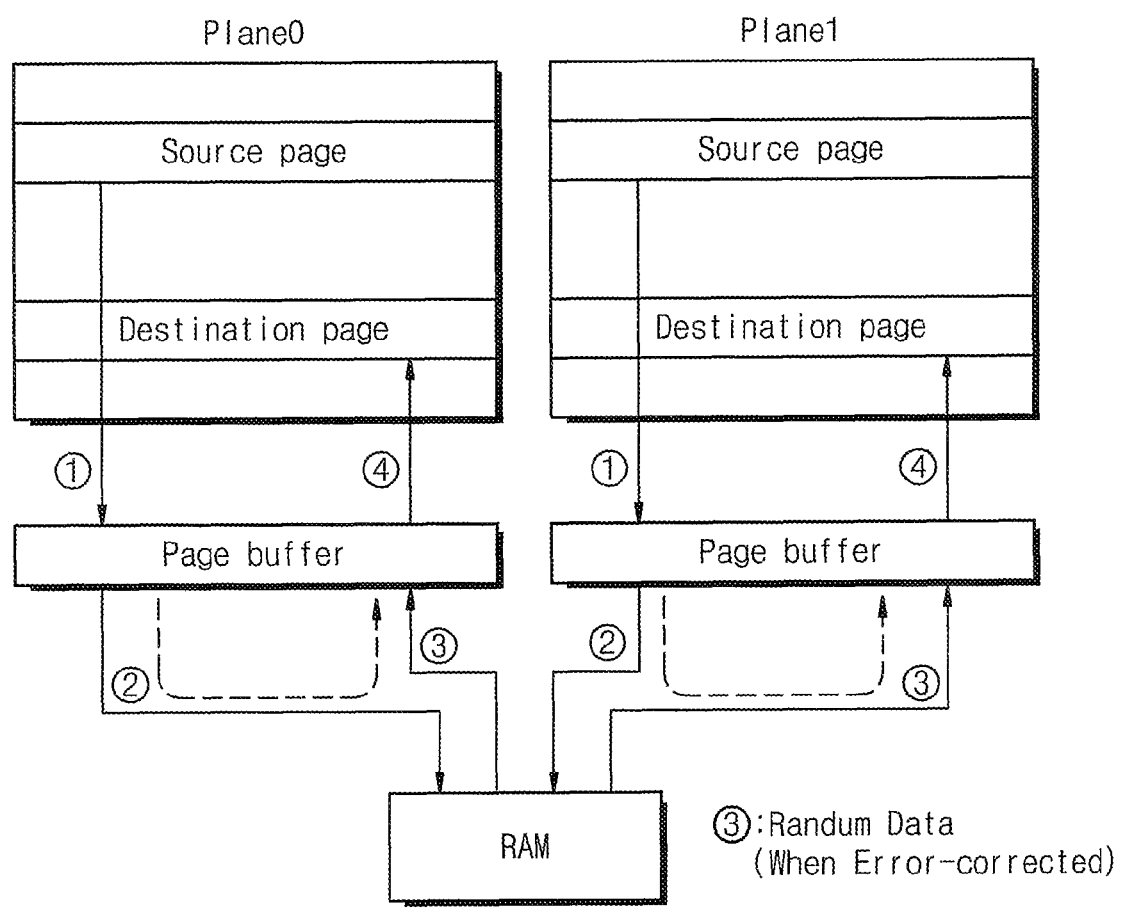
FIG. 9 is a diagram for describing a 2-plane copy-back program operation of a memory system according to an exemplary disclosed embodiment.
Figure 10:
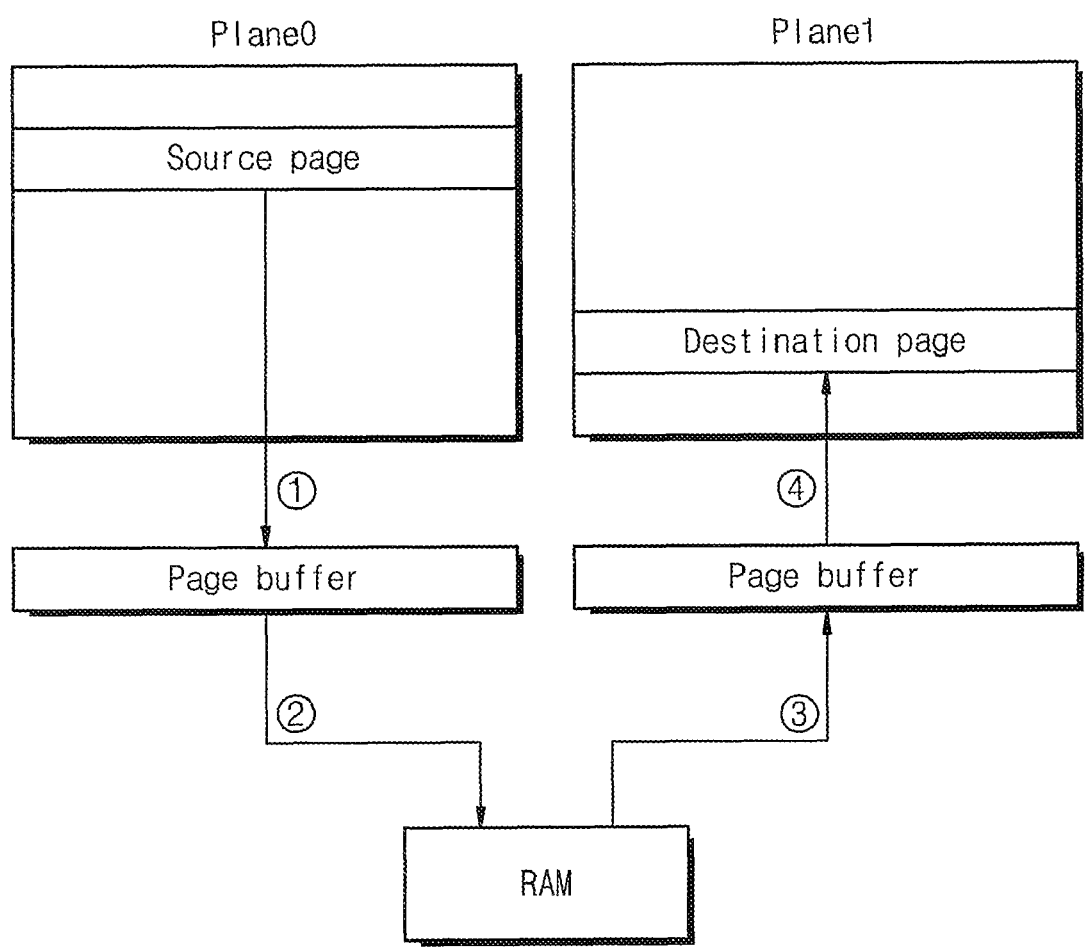
FIG. 10 is a diagram for describing a 2-plane copy-back program operation of a memory system according to an alternative exemplary disclosed embodiment.

If the flash memory 100 includes two planes, a 2-plane copy-back program operation may be carried out automatically by a flash controller 200 in the same manner as described above. For example, an address register 220 in FIG. 2A may be set with source and destination addresses of a first plane and source and destination addresses of a second plane by the CPU 300. In this case, plane selection information of the control register 230 may be set such that the two planes are selected at the same time. After the address and control registers are set, data from a source page in each plane may be moved into a page buffer at the same time (in FIG. 9, marked by ①). Then, data stored in the page buffer of the first plane may be transferred to the RAM 210 of the flash controller 200. At this time, as described above, the ECC 240 may detect whether the transferred data is erroneous (in FIG. 9, marked by ②). Subsequently, data stored in the page buffer of the second plane may be transferred to the RAM 210 of the flash controller 200. Similarly, the ECC 240 may detect whether the transferred data is erroneous (in FIG. 9, marked by ②). If an error is detected, then as described above, error-corrected data may be loaded onto corresponding page buffers together with destination addresses under the control of the flash controller 200 (in FIG. 9, marked by ③). Afterwards, data stored in the page buffers may be programmed in corresponding destination pages, respectively It may also be possible to copy-back program data read from a source page of one plane into a destination page of another plane. For example, referring to FIG. 10, an address register 220 in FIG. 2A may be set with a source address of a first plane and a destination address of a second plane by the CPU 300. In this case, plane selection information may be provided to the control register 230. After the address and control registers 220 and 230 are set, data of a source page in the first plane may be moved into a page buffer (in FIG. 10, marked by ①). Then, data stored in the page buffer of the first plane may be transferred to the RAM 210 of the flash controller 200. At this time, as described above, the ECC 240 may detect whether the transferred data is erroneous (in FIG. 10, marked by ②). Subsequently, data stored in the page buffer of the second plane may be transferred to the RAM 210 of the flash controller 200. If an error is detected, erroneous data in the RAM 210 may be corrected by the ECC 240. Data stored in the RAM 210 may be loaded onto a page buffer of the second plane together with destination address (in FIG. 10, marked by ③). Afterwards, data stored in the page buffer of the second plane may be programmed in a destination page (in FIG. 10, marked by ④).

Figure 11:
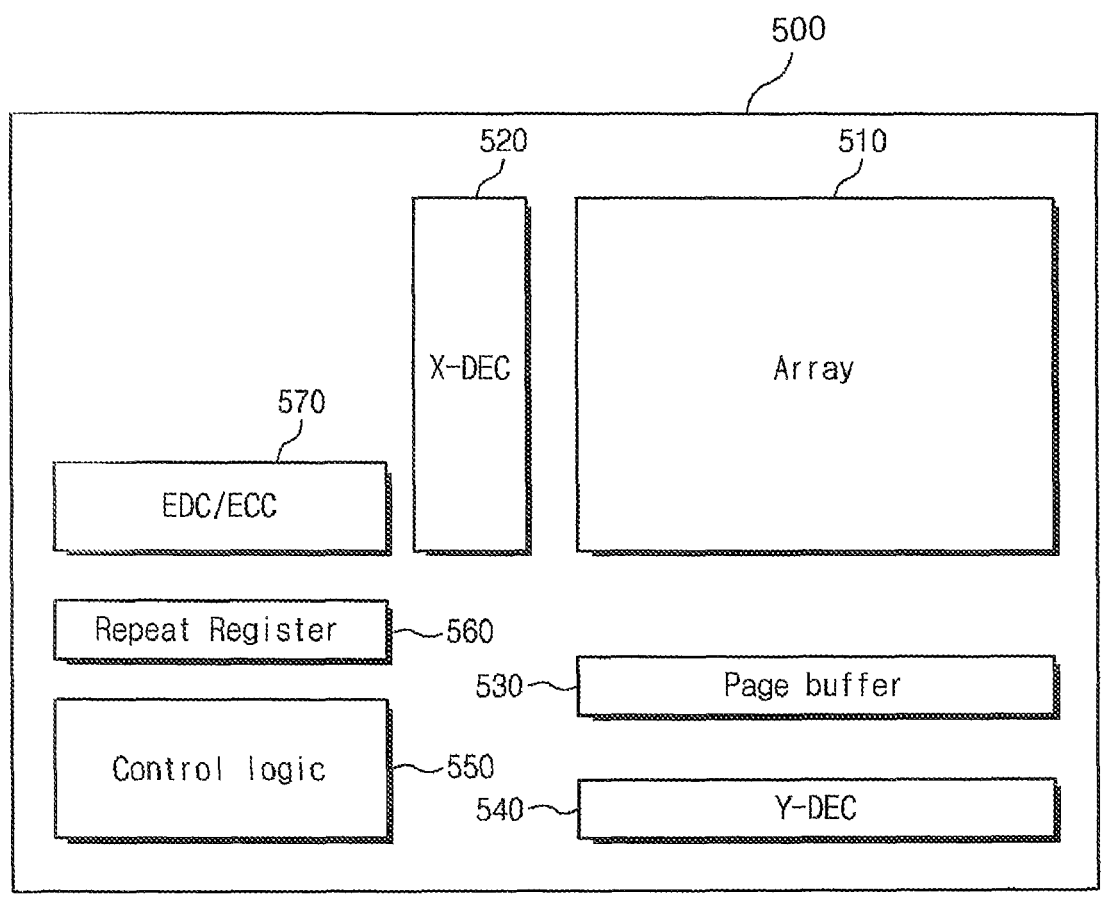
FIG. 11 is a block diagram showing a flash memory according to an alternative exemplary disclosed embodiment.

FIG. 11 is a block diagram showing a flash memory according to an exemplary disclosed embodiment. Referring to FIG.

11, a flash memory 500 may include a memory cell array 510, a row decoder circuit 520, a column decoder circuit 540, control logic 550, and a repeat register 560. The memory cell array 510, the row decoder circuit 520, the page buffer circuit 530, the column decoder circuit 540, and the control logic 550 are well known to one skilled in the art, and description thereof is thus omitted. The repeat register 560 may store hardware copy-back repeat number information, source address increment/decrement information, and destination address increment/decrement information. Furthermore, a copy-back program operation (as discussed above) may be repeated according to information stored in the repeat register 560, that is, by the hardware copy-back repeat number information. The flash memory device 100 further includes an error detecting block 570. The error detecting block 570 may be configured to detect whether an error is generated during a copy-back program operation. In particular, when an error is detected during the copy-back program operation, the control logic 550 may terminate a program operation. After the program operation is terminated, the control logic 550 may output failed-page information to an external device (e.g., memory controller) via a status read operation.

Figure 12A:
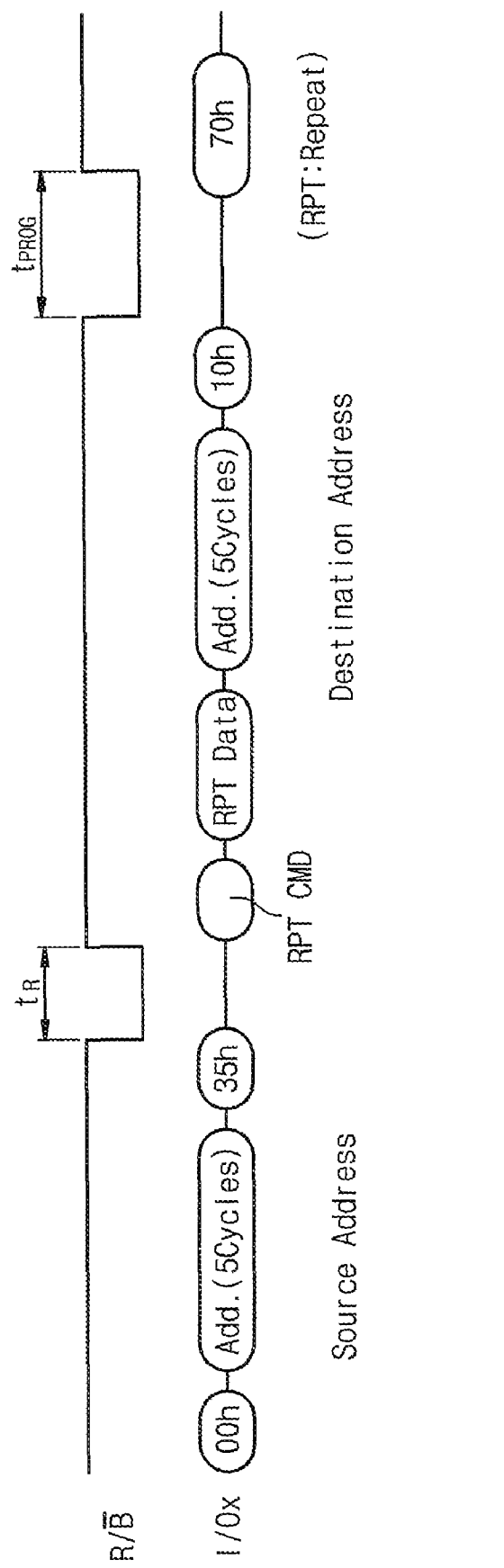
FIGS. 12A, 12B, 12C and 13A, 13B, and 13C are diagrams for describing methods for providing repeat command and data to a flash memory illustrated in FIG. 11 according to an exemplary disclosed embodiment.
Figure 12B:
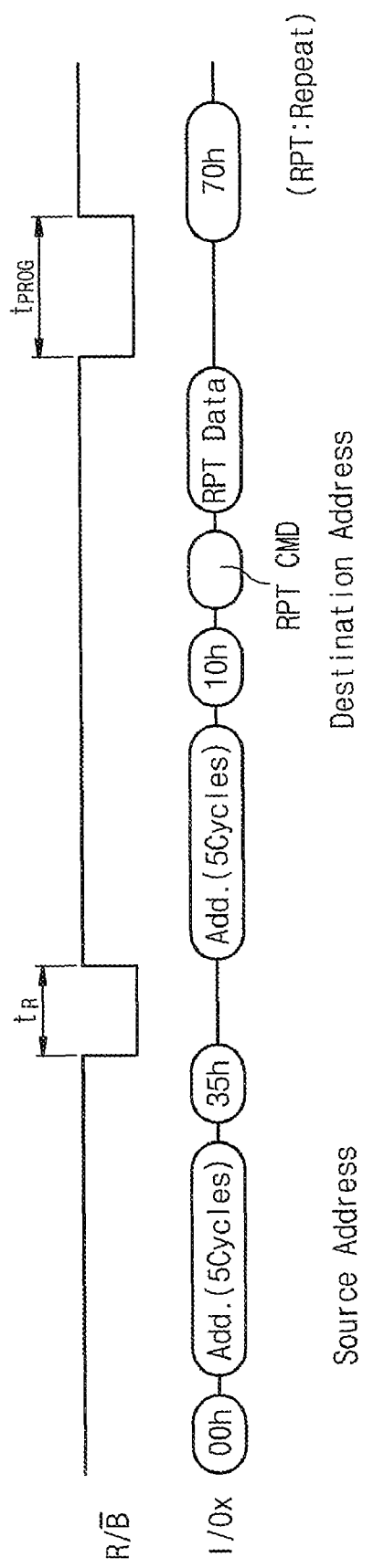
Figure 12C:
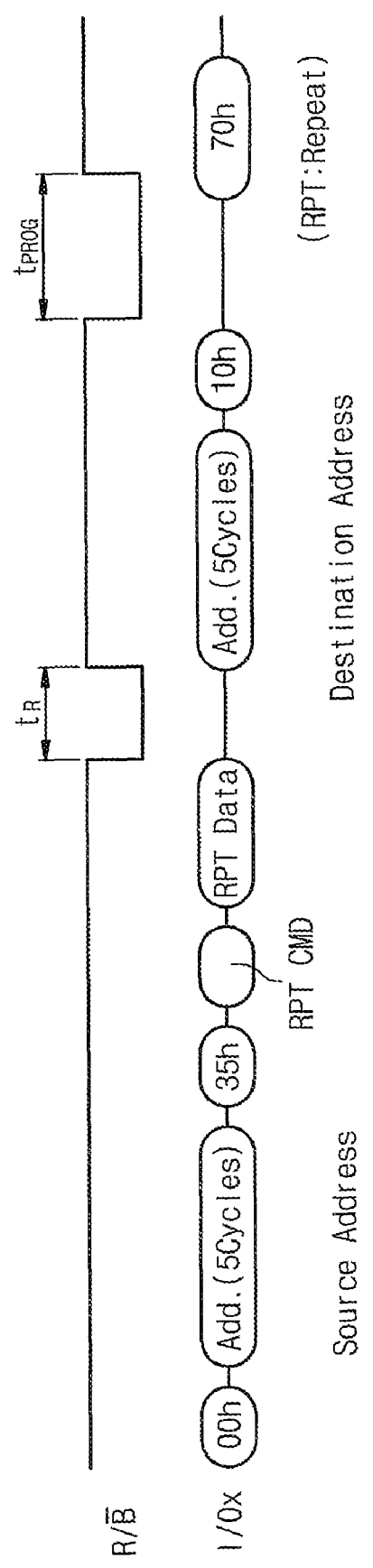

Methods of setting the repeat register 560 with repeat information may be implemented in different ways without departing from the scope of the present disclosure. For example, referring to FIG. 12A, after a read operation is carried out with respect to a page corresponding to a source address, a repeat command RPT CMD and repeat data may be provided to the flash memory device 500 from a memory controller. In an exemplary embodiment, the repeat data includes hardware copy-back repeat number information, source address increment/decrement information, and destination address increment/decrement information. The input repeat data may be stored in the repeat register 560. The repeat command RPT CMD and the repeat data may be input in different ways. For example, as illustrated in FIG. 12B, the repeat command RPT CMD and the repeat data may be provided to the flash memory device 500 after an input of a destination address and before the start of a program operation. Alternatively, as illustrated in FIG. 12C, the repeat command and the repeat data may be provided to the flash memory device 500 from the memory controller after an input of a source address and before the start of a read operation. Although not shown in figures, one skilled in the art will appreciate that the repeat command and the repeat data are input before an input of a source address.

Figure 13A:
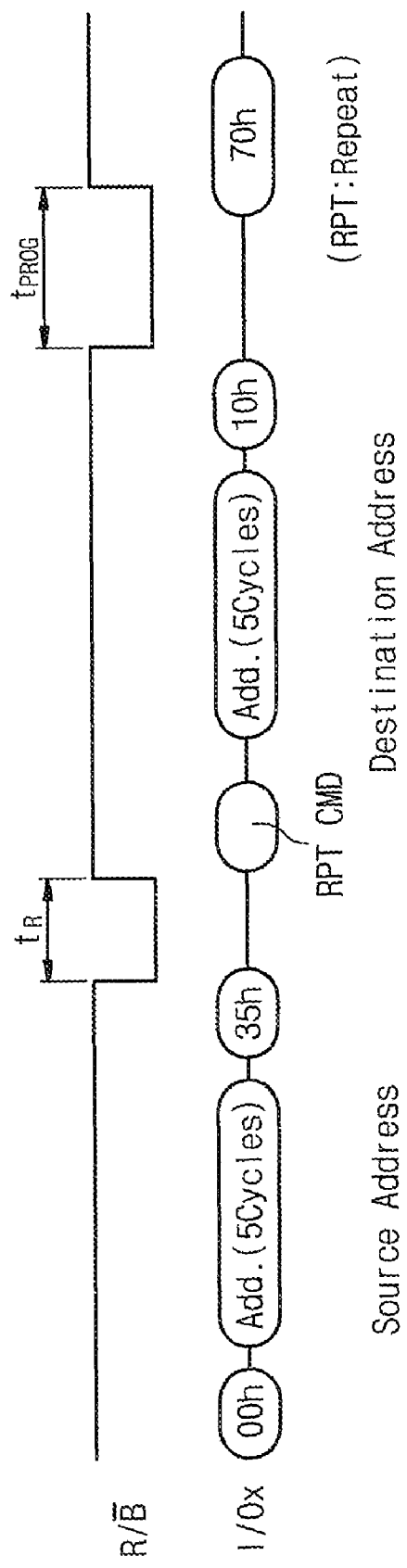
Figure 13B:
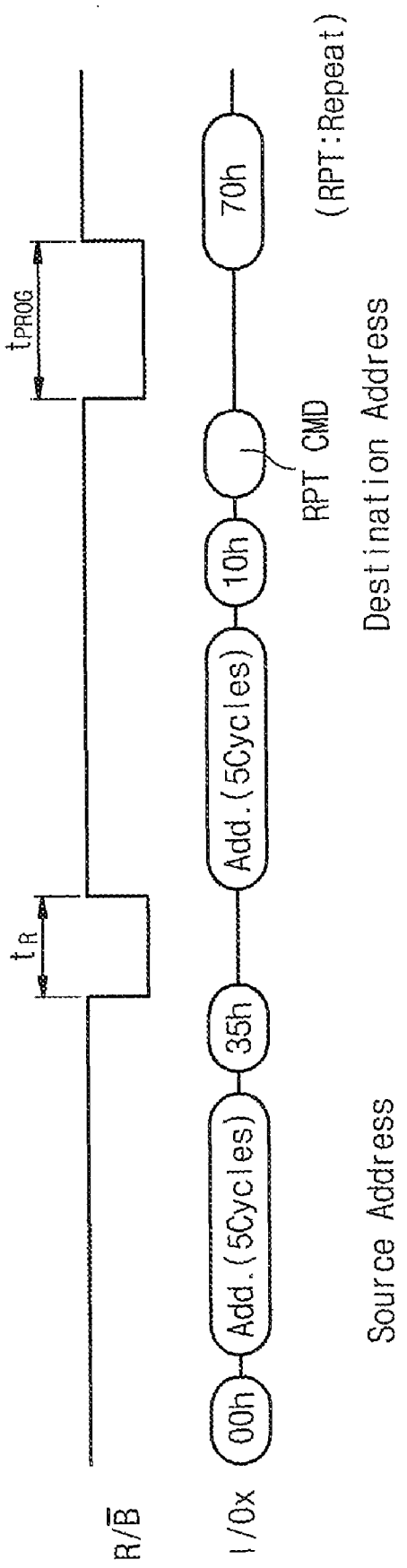
Figure 13C:
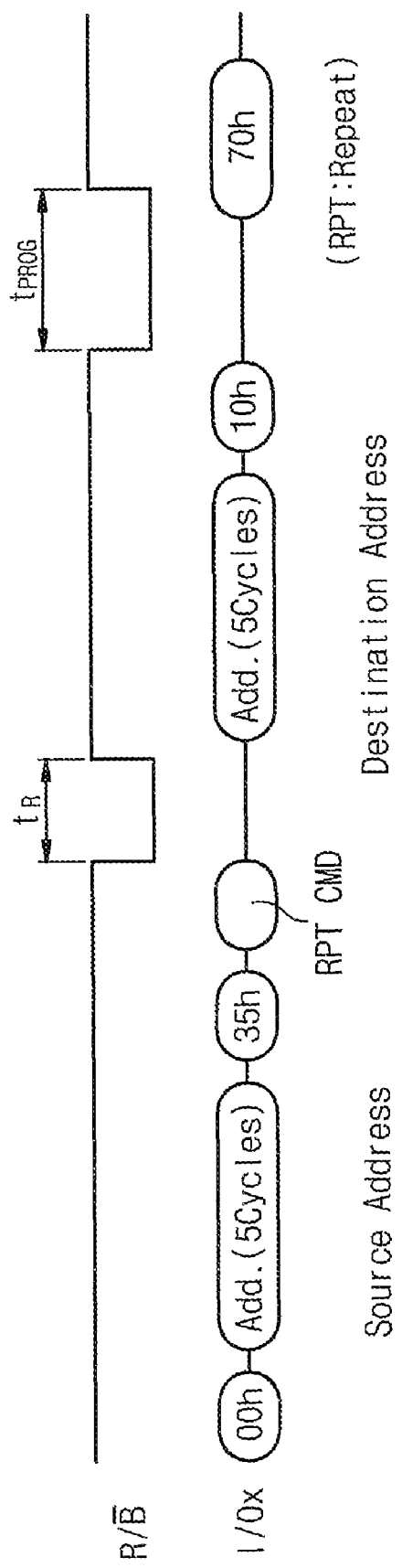

Unlike what is described in FIG. 12, in an alternative exemplary embodiment, only a repeat command RPT CMD may be provided to the flash memory device 500 without an input of repeat data. In this case, the repeat data may be provided to the flash memory device 500 from the repeat register 560 that includes stored repeat data. For example, the repeat register 560 may be implemented with a storage medium that has a non-volatile property so as to store given repeat data. Thus, when a repeat command is input, the flash memory device 500 may perform a copy-back program operation according to the given repeat data in the repeat register 560. Different methods may be used to determine when the repeat command RPT CMD is input without departing from the scope of the present disclosure. For example, referring to FIG. 13A, after a read operation is performed with respect to a page corresponding to a source address, a repeat command RPT CMD may be provided to the flash memory device 500 from the memory controller. Alternatively, as illustrated in FIG. 13B, the repeat command RPT CMD may be provided to the flash memory device 500 from the memory controller after an input of a destination address and before the start of a program operation. Alternatively, as illustrated in FIG. 13C, the repeat command RPT CMD may be provided to the flash memory device 500 from the memory controller after an input of a source address and before the start of a read operation. Although not shown in figures, one skilled in the art will appreciate that the repeat command and the repeat data may be input before an input of a source address without departing from the scope of the disclosure.

A repeat command described in FIG. 13 may consist of one of commands in FIG. 12, such as 00h, 35h, 10h, and so on. For example, a command 01h is changed into 11h, and the changed command 11h is provided to the flash memory device 500 as a repeat command. In this case, the given repeat data may be stored in the repeat register 560. Alternatively, the repeat data may also include a combination of commands.

Although the present invention has been described in connection with the exemplary disclosed embodiments illustrated in the accompanying drawings, it is not limited thereto. It will be apparent to those skilled in the art that various substitution, modifications and changes may be thereto without departing from the scope and spirit of the invention.

What is claimed is:

1. A memory system comprising:
    a flash memory;
    a processing unit which generates a source address and a destination address for a copy-back program operation of the flash memory, and which generates control information for the copy-back program operation; and
    a flash controller including an address register, a control register, and a state machine,
    wherein the address register is configured to store the source and destination addresses from the processing unit, and the control register is configured to store the control information from the processing unit,
    wherein the state machine is configured to access the address register and the control register, and is further configured to control execution of the copy-back program operation in hardware alone and independently of the processing unit based on the source and destination addresses stored in the address register and the control information stored in the control register, and
    wherein the state machine is further configured to control a repeat execution of the copy-back program operation based on copy-back repeat information stored in the control register.

2. The memory system of claim 1, wherein the state machine is further configured to notify the processing unit when execution of the copy-back program operation is complete.

3. The memory system of claim 1, wherein the flash controller is further configured to generate one or more commands, addresses, and data in hardware during the copy-back program operation.

4. The memory system of claim 1, wherein the state machine is further configured to control execution of an error correcting and detecting operation with respect to data stored in the flash controller during the copy-back program operation.

5. The memory system of claim 4, wherein when no error is detected in the stored data, the flash controller outputs a destination address and a command to the flash memory according to information set in the address register.

6. The memory system of claim 4, wherein when an error is detected in the stored data, the flash controller outputs a destination address and a command to the flash memory together with error-corrected data according to information set in the address register.

7. The memory system of claim 1, wherein during the copy-back program operation, page data is copied back to a same plane of the flash memory, source and destination addresses of the same plane being stored in the address register.

8. The memory system of claim 1, wherein during the copy-back program operation, page data is copied back in different planes of the flash memory at the same time, source and destination addresses of each plane being stored in the address register.

9. The memory system of claim 1, wherein during the copy-back program operation, page data is copied back from a first plane to a second plane of the flash memory.

10. The memory system of claim 1, wherein the control register is further configured to store control information including at least one of hardware copy-back program start information, interrupt enable information, interrupt status information, ECC auto correction information, copy-back repeat number information, source address increment/decrement information, destination address increment/decrement information, and plane selection information.

11. The memory system of claim 10, wherein the state machine is further configured to control a copy-back program operation when the hardware copy-back program start information of the control register is set.

12. The memory system of claim 10, wherein the copy-back repeat information includes at least one of the copy-back repeat number information, the source address increment/decrement information, and the destination address increment/decrement information.

13. The memory system of claim 1, further including a first RAM which temporarily stores data to be stored in the flash memory.

14. The memory system of claim 13, wherein the flash controller, the processing unit, and the first RAM are electrically connected to a system bus.

15. The memory system of claim 14, wherein the flash controller comprises:
  a second RAM configured to temporarily store data read from the flash memory for the copy-back program operation;
  an error detecting and correcting circuit configured to detect and correct an error with respect to the data read from the flash memory.

16. The memory system of claim 15, wherein the second RAM is electrically isolated from the system bus.

17. The memory system of claim 1, wherein the memory system includes a memory card.

\* \* \* \* \*